United States Patent
Yuan et al.

(10) Patent No.: US 11,257,432 B2
(45) Date of Patent: Feb. 22, 2022

(54) DISPLAY PANEL, DRIVING METHOD THEREOF, AND DISPLAY DEVICE COMPRISING A PLURALITY OF PIXEL UNITS, DATA LINES AND SENSING LINES

(71) Applicants: HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Meng Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/767,296

(22) PCT Filed: Jan. 8, 2020

(86) PCT No.: PCT/CN2020/070886
§ 371 (c)(1),
(2) Date: May 27, 2020

(87) PCT Pub. No.: WO2020/168849
PCT Pub. Date: Aug. 27, 2020

(65) Prior Publication Data
US 2021/0201787 A1 Jul. 1, 2021

(30) Foreign Application Priority Data
Feb. 21, 2019 (CN) .......................... 201910129993.5

(51) Int. Cl.
*G09G 3/3241* (2016.01)
*G09G 3/20* (2006.01)
*G09G 3/3291* (2016.01)

(52) U.S. Cl.
CPC ......... *G09G 3/3241* (2013.01); *G09G 3/2003* (2013.01); *G09G 3/3291* (2013.01);
(Continued)

(58) Field of Classification Search
CPC ...... G09G 3/2003; G09G 3/2074; G09G 3/30; G09G 3/32; G09G 3/3208; G09G 3/3225;
(Continued)

(56) References Cited

U.S. PATENT DOCUMENTS 9,646,533 B2   5/2017   Hong et al.
10,068,520 B2  9/2018   Xiang et al.
(Continued)

FOREIGN PATENT DOCUMENTS

CN   103886826 A   6/2014
CN   104036731 A   9/2014
(Continued)

OTHER PUBLICATIONS

First Chinese Office Action from Chinese Patent Application No. 201910129993.5 dated Apr. 29, 2020.

*Primary Examiner* — Keith L Crawley
(74) *Attorney, Agent, or Firm* — Dilworth & Barrese, LLP.; Michael J. Musella, Esq.

(57) ABSTRACT

A display panel, a display device, and a driving method of the display panel are provided. The display panel includes a plurality of pixel units arranged in an array and data lines and sensing lines connected to the pixel units, and each of the plurality of pixel units includes a plurality of sub-pixels; all sub-pixels in a same column of pixel units are connected to a same data line, each column of pixel units is respectively (Continued)

connected to two of the sensing lines, and any two adjacent columns of pixel units share one of the sensing line.

18 Claims, 7 Drawing Sheets

(52) U.S. Cl.
CPC ............... *G09G 2300/0443* (2013.01); *G09G 2310/063* (2013.01)

(58) Field of Classification Search
CPC .... G09G 3/3233; G09G 3/3241; G09G 3/325; G09G 3/3258; G09G 3/3291; G09G 2300/0426; G09G 2300/043; G09G 2300/0443; G09G 2300/0452; G09G 2300/0809; G09G 2310/02; G09G 2310/0202; G09G 2310/0205; G09G 2310/0208; G09G 2310/021; G09G 2310/0218; G09G 2310/0262; G09G 2310/063; G09G 2320/043; G09G 2320/045; H01L 27/32; H01L 27/3211; H01L 27/3218; H01L 27/3244; H01L 27/326; H01L 27/3276; H01L 27/3297
See application file for complete search history.

(56) References Cited

U.S. PATENT DOCUMENTS

| | | | |
|---|---|---|---|
| 2016/0035280 A1 | 2/2016 | Kim et al. | |
| 2016/0327819 A1 | 11/2016 | Chao | |
| 2018/0074629 A1 | 3/2018 | Lee et al. | |
| 2019/0035334 A1* | 1/2019 | Lin | G09G 3/3266 |
| 2019/0066588 A1* | 2/2019 | Lin | G09G 3/3258 |
| 2019/0304362 A1* | 10/2019 | Yuan | G09G 3/3233 |
| 2020/0160794 A1* | 5/2020 | Park | G09G 3/3291 |
| 2021/0005692 A1* | 1/2021 | Yuan | G09G 3/3233 |
| 2021/0134223 A1* | 5/2021 | Li | G09G 3/3258 |

FOREIGN PATENT DOCUMENTS

| | | | | |
|---|---|---|---|---|
| CN | 104715717 A | | 6/2015 | |
| CN | 106297668 A | * | 1/2017 | ........... G09G 3/3258 |
| CN | 106548752 A | | 3/2017 | |
| CN | 108766993 A | | 11/2018 | |
| CN | 109166529 A | | 1/2019 | |
| KR | 1020160061474 A | | 6/2016 | |
| KR | 1020170079330 A | | 7/2017 | |

* cited by examiner

DISPLAY PANEL, DRIVING METHOD THEREOF, AND DISPLAY DEVICE COMPRISING A PLURALITY OF PIXEL UNITS, DATA LINES AND SENSING LINES

The present application claims priority of the Chinese Patent Application No. 201910129993.5 filed on Feb. 21, 2019, the disclosure of which is incorporated herein by reference in its entirety as part of the present application.

TECHNICAL FIELD

Embodiments of the present disclosure relate to a display panel, a driving method thereof, and a display device.

BACKGROUND

With the continuous development of display technology, OLED (Organic Light-Emitting Diode) display panels have attracted wide attention due to advantages of low power consumption, low production cost, self-luminescence, wide viewing angle, fast response speed, and the like.

SUMMARY

At least one embodiment of the present disclosure provides a display panel, which includes a plurality of pixel units arranged in an array, and data lines and sensing lines connected to the plurality of pixel units, respectively, each of the plurality of pixel units including a plurality of sub-pixels; and all sub-pixels in a same column of pixel units are connected to a same data line, each column of pixel units a respectively connected to two of the sensing lines, and any two adjacent columns of pixel units share one of the sensing lines.

For example, the display panel provided by at least one embodiment of the present disclosure further includes gate line groups connected to the sub-pixels, each row of pixel units are respectively connected to two of the gate line groups to receive scan driving signals, any two adjacent rows of pixel units share one of the gate line groups, and each of the gate line groups includes a first gate line and a second gate line.

For example, in the display panel provided by at least one embodiment of the present disclosure, the display panel comprises M×N pixel units and N+1 rows of gate line groups, and each of the plurality of pixel units comprises a first sub-pixel, a second sub-pixel, and a third sub-pixel; a first sub-pixel of a pixel unit in an (n)-th row and an (m)-th column is connected to a first gate line in the (n)-th row, a second gate line in the (n)-th row, a sensing line in the (m)-th column, and a data line in the (m)-th column, respectively; a second sub-pixel of the pixel unit in the (n)-th row and the (m)-th column is connected to a first gate line in an (n+1)-th row, a second gate line in the (n+1)-th row, a sensing line in an (m+1)-th column, and a data line in the (m)-th column, respectively; a third sub-pixel of the pixel unit in the (n)-th row and the (m)-th column is connected to the first gate line in the (n)-th row, the second gate line in the (n+1)-th row, the sensing line in the (m)-th column, and the data line in the (m)-th column; and M represents an amount of the pixel units in a column direction, N represents an amount of the pixel units in a row direction, $1 \leq n \leq N$, $1 \leq m \leq M$, and both M and N are positive integers greater than 1.

For example, in the display panel provided by at least one embodiment of the present disclosure, each of the plurality of sub-pixels includes a light-emitting element, a pixel driving circuit configured for driving the light-emitting element to emit light, and a sensing circuit configured for sensing the pixel driving circuit, and the pixel driving circuit includes a data writing sub-circuit and a driving sub-circuit; the driving sub-circuit is connected to the data writing sub-circuit, the light-emitting element and the sensing circuit, and is configured to control a driving current for driving the light-emitting element to emit light; the data writing sub-circuit is configured to receive a scan driving signal, and to write a data voltage to the driving sub-circuit in response to the scan driving signal; and the sensing circuit is further connected to the driving sub-circuit, and is configured to receive the scan driving signal, and to write a reference voltage signal to the driving sub-circuit or to read a sensing voltage signal from the driving sub-circuit in response to the scan driving signal.

For example, in the display panel provided by at least one embodiment of the present disclosure, the pixel driving circuit further includes a storage sub-circuit, and the storage sub-circuit is connected to the light-emitting element and is configured to store the data voltage being written and the reference voltage signal.

For example, in the display panel provided by at least one embodiment of the present disclosure, the sensing circuit includes a first transistor, the data writing sub-circuit includes a second transistor, the driving sub-circuit includes a driving transistor, and the storage sub-circuit includes a storage capacitor; for the first sub-pixel of the pixel unit in the (n)-th row and (m)-th column, a gate electrode of the first transistor is connected to the first gate line in the (n)-th row, a first electrode of the first transistor is connected to the sensing line in the (m)-th column, a gate electrode of the second transistor is connected to the second gate line in the (n)-th row, and a first electrode of the second transistor is connected to the data line in the (m)-th column; for the second sub-pixel of the pixel unit in the (n)-th row and the (m)-th column, a gate electrode of the first transistor is connected to the first gate line in the (n+1)-th row, a first electrode of the first transistor is connected to the sensing line in the (m+1)-th column, a gate electrode of the second transistor is connected to the second gate line in the (n+1)-th row, and a first electrode of the second transistor is connected to the data line in the (m)-th column; for the third sub-pixel of the pixel unit in the (n)-th row and the (m)-th column, a gate electrode of the first transistor is connected to the second gate line in the (n+1)-th row, a first electrode of the first transistor is connected to the sensing line in the (m)-th column, a gate electrode of the second transistor is connected to the first gate line in the (n)-th row, and a first electrode of the second transistor is connected to the data line in the (m)-th column; and for any one of the sub-pixels, a second electrode of the first transistor is connected to a first terminal of the storage capacitor, a second electrode of the second transistor is connected to a second terminal of the storage capacitor, a gate electrode of the driving transistor is connected to the second electrode of the second transistor, a first electrode of the driving transistor is connected to an anode of the light-emitting element, a second electrode of the driving transistor is connected to a first voltage terminal to receive a first voltage, the first terminal of the storage capacitor is further connected to the anode of the light-emitting element, and a cathode of the light-emitting element is connected to a second voltage terminal to receive a second voltage.

For example, in the display panel provided by at least one embodiment of the present disclosure, the first transistor, the second transistor and the driving transistor are all N-type transistors or are all P-type transistors.

For example, in the display panel provided by at least one embodiment of the present disclosure, a color of light emitted by first sub-pixels of pixel units in the (n)-th row is identical to a color of light emitted by second sub-pixels of pixel units in the (n+1)-th row, and a color of light emitted by second sub-pixels of the pixel units in the (n)-th row is identical to a color of light emitted by the first sub-pixels of the pixel units in the (n+1)-th row.

For example, in the display panel provided by at least one embodiment of the present disclosure, colors of light emitted by third sub-pixels in respective pixel units are identical to each other.

For example, in the display panel provided by at least one embodiment of the present disclosure, a color of light emitted by the first sub-pixel, a color of light emitted by the second sub-pixel and a color of light emitted by the third sub-pixel are different from each other in each of the plurality of pixel units.

At least one embodiment of the present disclosure further provides a display device, which includes the display panel provided by any one embodiment of the present disclosure.

For example, the display device provided by at least one embodiment of the present disclosure further includes a source driving chip, the source driving chip is connected to the data lines in the display panel to provide data voltages, and the source driving chip is connected to the sensing lines in the display panel to provide reference voltage signals or to receive sensing voltage signals.

For example, the display device provided by at least one embodiment of the present disclosure further includes a gate driving chip, and the gate driving chip is connected to gate line groups in the display panel and is configured to provide scan driving signals to the plurality of pixel units in the display panel through the gate line groups.

At least one embodiment of the present disclosure further provides a driving method of the display panel, which includes a display period and a blanking period for one frame, and the driving method includes: in the display period, sequentially providing, by the gate line groups, scan driving signals to the N rows of pixel units, so that pixel driving circuits in the N rows of pixel units drive light-emitting elements in the N rows of pixel units to emit light, respectively; in the blanking period, providing, by the gate line groups, the scan driving signals to an (i)-th row of pixel units in the N rows of pixel units, so that sensing circuits in the (i)-th row of pixel units perform sense; and $1 \leq i \leq N$.

For example, in the driving method provided by at least one embodiment of the present disclosure, in the display period, a driving cycle of each row of pixel units in the N rows of pixel units includes a first time period, a second time period, a third time period, and a fourth time period; in the first time period, a scan driving signal of a first gate line in an (n−1)-th row and a scan driving signal input by the second gate line in the (n)-th row are both at a high level, so as to write a data voltage to a third sub-pixel of a pixel unit in the (n−1)-th row and the (m)-th column; in the second time period, a scan driving signal of the second gate line in the (n)-th row and a scan driving signal of the first gate line in the (n)-th row are both at a high level, so as to write the data voltage into a second sub-pixel of the pixel unit in the (n−1)-th row and the (m)-th column and into the first sub-pixel of the pixel unit in the (n)-th row and the (m)-th column; in the third time period, the scan driving signal input by the first gate line in the (n−1)-th row and the scan driving signal input by the second gate line in the (n)-th row are both at a low level, so that the third sub-pixel of the pixel unit in the (n−1)-th row and the (m)-th column emits light; and the scan driving signal of the first gate line in the (n)-th row and a scan driving signal of the second gate line in the (n+1)-th row are both at a high level, so as to write the data voltage to the third sub-pixel of the pixel unit in the (n)-th row and the (m)-th column; and in the fourth time period, the scan driving signal input by the second gate line in the (n)-th row and the scan driving signal input by the first gate line in the (n)-th row are both at a low level, so that the second sub-pixel of the pixel unit in the (n−1)-th row and the (m)-th column and the first sub-pixel of the pixel unit in the (n)-th row and the (m)-th column emit light; and the scan driving signal of the second gate line in the (n+1)-th row and a scan driving signal of the first gate line in the (n+1)-th row are both at a high level, so as to write the data voltage to the second sub-pixel of the pixel unit in the (n)-th row and the (m)-th column and into a first sub-pixel of the pixel unit in the (n+1)-th row and the (m)-th column.

For example, the driving method provided by at least one embodiment of the present disclosure further includes: inputting a reference voltage signal to both a sensing line in the (m)-th column and a sensing line in the (m+1)-th column.

For example, in the driving method provided by at least one embodiment of the present disclosure, in the blanking period, a driving cycle of each row of pixel units in the N rows of pixel units comprises a fifth time period, a sixth time period, a seventh time period, and an eighth time period; in the fifth time period, a sensing voltage signal of a first sub-pixel of a pixel unit in an (n−1)-th row and the (m)-th column and a sensing voltage signal of a second sub-pixel of a pixel unit in an (n−2)-th row and the (m)-th column are read, so as to compensate for the first sub-pixel of the pixel unit in the (n−1)-th row and the (m)-th column and the second sub-pixel of the pixel unit in the (n−2)-th row and the (m)-th column; in the sixth time period, a sensing voltage signal of a third sub-pixel of the pixel unit in the (n−1)-th row and the (m)-th column is read, so as to compensate for the third sub-pixel of the pixel unit in the (n−1)-th row and the (m)-th column; in the seventh time period, a sensing voltage signal of the first sub-pixel of the pixel unit in the (n)-th row and the (m)-th column and a sensing voltage signal of a second sub-pixel of the pixel unit in the (n−1)-th row and the (m)-th column are read, so as to compensate for the first sub-pixel of the pixel unit in the (n)-th row and the (m)-th column and the second sub-pixel of the pixel unit in the (n−1)-th row and the (m)-th column; and in the eighth time period, a sensing voltage signal of the third sub-pixel of the pixel unit in the (n)-th row and the (m)-th column is read, so as to compensate for the third sub-pixel of the pixel unit in the (n)-th row and the (m)-th column; and $3 \leq n \leq N$, and N is a positive integer greater than 3.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
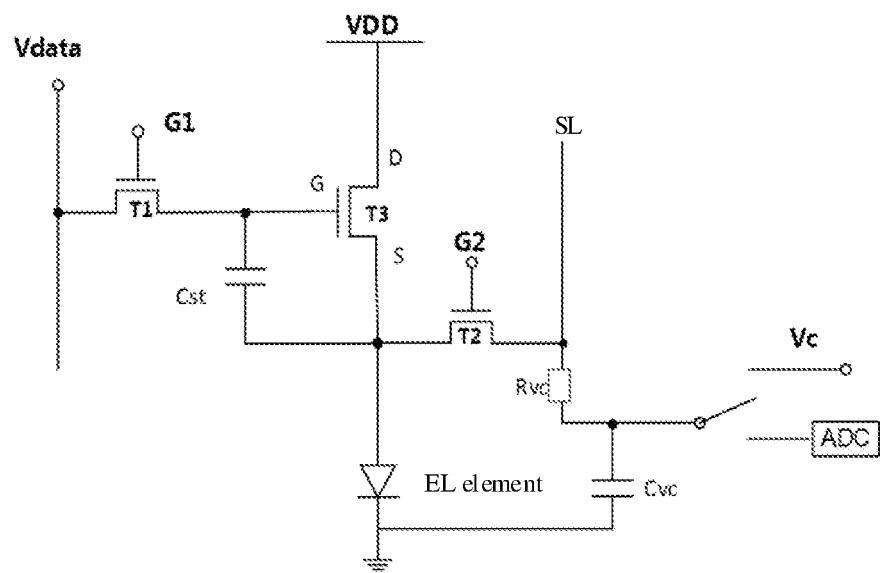
FIG. 1A is a schematic diagram of a pixel circuit.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below with reference to some specific embodiments. In order to keep the following description of the embodiments of the present disclosure clear and concise, detailed descriptions of known functions and known components may be omitted. In the case where any one component of an embodiment of the present disclosure appears in more than one of the accompanying drawings, the component is denoted by a same reference numeral in each of the drawings.

The pixel circuit in the OLED display device generally adopts a matrix driving mode, which is divided into active matrix driving and passive matrix driving according to whether a switching element is introduced into each pixel unit. AMOLED integrates a set of thin film transistors and storage capacitors in a pixel circuit of each pixel. Through the driving control of the thin film transistors and storage capacitors, the current flowing through the OLED is controlled, so that the OLED emits light as required. A basic pixel circuit used in the AMOLED display device is usually a 2T1C pixel circuit, that is, two thin film transistors (TFTs) and one storage capacitor Cst are used to realize the function of driving the OLED to emit light.

In a common OLED display panel, compensation technology is needed to improve the display quality. When compensating for sub-pixel units in the OLED display panel, in addition to performing internal compensation by setting a pixel compensation circuit in the sub-pixel units, external compensation can also be performed by setting a sensing transistor. FIG. 1A is a schematic diagram of an externally compensated pixel circuit. As shown in FIG. 1A, the pixel circuit includes a switching transistor T1, a driving transistor T3, a storage capacitor Cst, a sensing transistor T2, and an organic electroluminescent (EL) element (i.e., an organic light-emitting diode). For example, the sensing transistor T2 can realize the compensation function. For example, a gate electrode of the switching transistor T1 is connected to a gate line to receive a scan driving signal G1; for example, a source electrode of the switching transistor T1 is connected to a data line to receive a data signal Vdata; a drain electrode of the switching transistor T1 is connected to a gate electrode of the driving transistor T3; a drain electrode of the driving transistor T3 is connected to a first voltage terminal to receive a first voltage Vdd (high voltage), and a source electrode of the driving transistor T3 is connected to a positive terminal of the EL element; a terminal of the storage capacitor Cst is connected to the drain electrode of the switching transistor T1 and the gate electrode of the driving transistor T3, and the other terminal of the storage capacitor Cst is connected to the source electrode of the driving transistor T3; and a negative terminal of the EL element is connected to a second voltage terminal to receive a second voltage Vss (low voltage, such as a ground voltage). For example, in the case where the scan signal G1 is applied through the gate line to turn on the switching transistor T1, the data signal Vdata input by a data driving circuit through the data line can charge the storage capacitor Cst via the switching transistor T1, so that the data signal Vdata can be stored in the storage capacitor Cst, and the stored data signal Vdata can control a turn-on degree of the driving transistor T3, thereby controlling a current flowing through the driving transistor T3 to drive the OLED to emit light, that is, the current determines the grayscale of the light emitted by the pixel.

As shown in FIG. 1A, a first electrode of the sensing transistor T2 is connected to the source electrode of the driving transistor T3, a second electrode of the sensing transistor T2 is connected to a detection circuit (e.g., including a resistor Rvc, a capacitor Cvc, and a device, such as an analog-to-digital converter (ADC), an amplifier, etc.) through a sensing line SL, and a gate electrode of the sensing transistor T2 receives a compensation scan signal G2. Thus, after the compensation scan signal G2 is applied to turn on the driving transistor T3, the detection circuit is charged via the sensing transistor T2, so that a potential of the source electrode of the driving transistor T3 is changed. When the voltage Vs at the source electrode of the driving transistor T3 is equal to a difference between a gate voltage Vg of the driving transistor T3 and a threshold voltage Vth of the driving transistor T3, the driving transistor T3 is turned off. At this time, after the driving transistor T3 is turned off, a sensing voltage (that is, a voltage Vb at the source electrode after the driving transistor T3 is turned off) can be acquired from the source electrode of the driving transistor T3 via the sensing transistor T2 which is turned on. After obtaining the voltage Vb at the source electrode after the driving transistor T3 is turned off, the threshold voltage Vth=Vdata−Vb of the driving transistor can be obtained. Therefore, compensation data can be established (i.e., determined) for each pixel circuit based on the threshold voltage of the driving transistor in each pixel circuit, thereby realizing the threshold voltage compensation function of each sub-pixel on the display panel.

In order to pursue better display effect, high-resolution OLED display panels, such as 8K display panels, have emerged. After a high-resolution OLED display panel is manufactured, it is needed to connect a source driving chip to the data lines and sensing lines in the display panel by means of COF (Chip On Film). Specifically, for example, one side of the COF is bonded with the data lines and sense lines in the display panel, and the other side of the COF is bonded with a circuit board on which the source driving chip is fixed.

However, in the high-resolution OLED display panel, an amount of data lines and sensing lines increases greatly. In order to input the signals provided by the source driving chip to the data lines and sensing lines, an amount of signal transmission lines which need to be designed on the circuit board and the COF also needs to be increased, so that the hardware cost is increased, and the bonding difficulty is also increased in the case where the COF is used for bonding.

At least one embodiment of the present disclosure provides a display panel, which includes a plurality of pixel units arranged in an array and data lines and sensing lines connected to the pixel units, and each of the plurality of pixel units includes a plurality of sub-pixels; and all sub-pixels in a same column of pixel units are connected to a same data line, each column of pixel units are respectively connected to two of the sensing lines, and any two adjacent columns of pixel units share one of the sensing lines.

In the embodiments of the present disclosure, all sub-pixels in a same column of pixel units are connected to a same data line, each column of pixel units are respectively connected to two sensing lines, and any two adjacent columns of pixel units share one sensing line, so that the amount of data lines and sensing lines is reduced; and in the case where a source driving chip is subsequently connected to the data lines and sensing lines in the display panel by COF, hardware cost and bonding difficulty can be reduced, and bonding yield can be improved.

In order to make the above objects, features and advantages of the present disclosure more apparent, the present disclosure will be described in further detail below with reference to the accompanying drawings and specific embodiments.

Figure 1B:
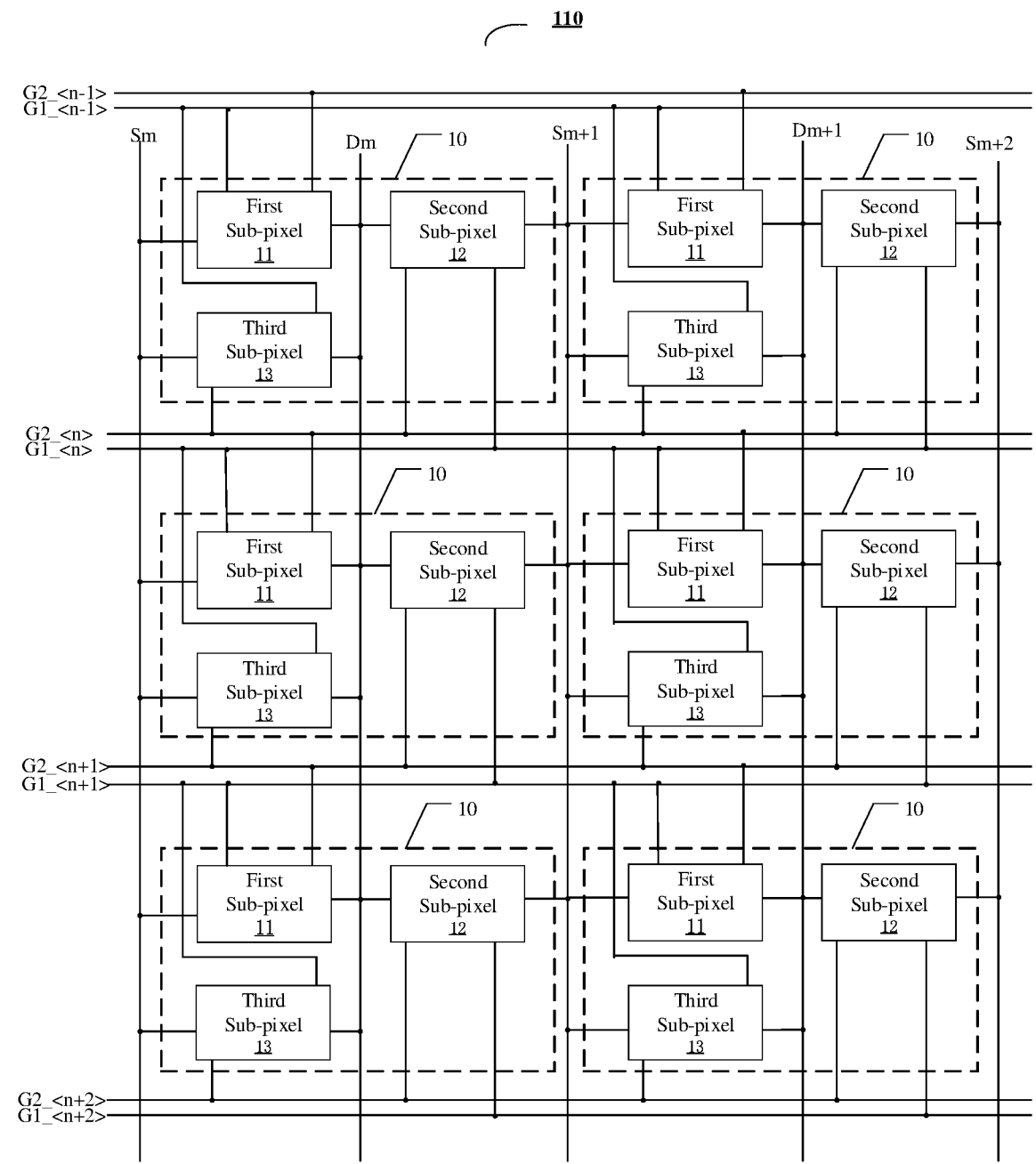
FIG. 1B is a structural schematic diagram of a display panel provided by at least one embodiment of the present disclosure.

At least one embodiment of the present disclosure provides a display panel, and FIG. 1B shows a structural schematic diagram of a display panel provided by at least one embodiment of the present disclosure.

As shown in FIG. 1B, the display panel 110 includes a plurality of pixel units 10 arranged in an array and data lines and sensing lines connected to the pixel units 10, such as a data line Dm, a data line Dm+1, a sensing line Sm, a sensing line Sm+1, and a sensing line Sm+2 as shown in FIG. 1B, and each pixel unit 10 includes 3 sub-pixels. For example, as shown in FIG. 1B, all sub-pixels in a same column of pixel units 10 are connected to a same data line, each column of pixel units 10 are connected to two of the sensing lines respectively, and any two adjacent columns of pixel units share one of the sensing line. For example, the sensing line is configured to provide a sensing signal (e.g., a reference voltage signal) or to receive a sensing voltage signal. For example, m is an integer greater than or equal to 1.

It should be noted that each pixel unit 10 can also include more sub-pixels, such as 6 sub-pixels, 9 sub-pixels, etc., the embodiments of the present disclosure are not limited to thereto.

As shown in FIG. 1B, from left to right, an (m)-th column of pixel units 10 and an (m+1)-th column of pixel units 10 are located, respectively. All sub-pixels in the (m)-th column of pixel units 10 are connected to the data line Dm, and all sub-pixels in the (m+1)-th column of pixel units 10 are connected to the data line Dm+1, thereby reducing the amount of data lines in the display panel. The (m)-th column of pixel units 10 are connected to the sensing line Sm and the sensing line Sm+1, respectively, and the (m+1)-th column of pixel units 10 are connected to the sensing line Sm+1 and the sensing line Sm+2, respectively. Therefore, it can be seen that the (m)-th column of pixel units 10 and the (m+1)-th column of pixel units 10 share the sensing line Sm+1, thereby reducing the amount of sensing lines in the display panel.

Hereinafter, the difference between the amount of data lines and sensing lines in the embodiment of the present disclosure and the amount of data lines and sensing lines in an existing display panel will be illustrated by taking the case in which the display panel includes M×N pixel units 10 and each pixel unit 10 includes a first sub-pixel 11, a second sub-pixel 12, and a third sub-pixel 13 as an example. For example, M represents an amount of the pixel units in a column direction, N represents an amount of the pixel units in a row direction, and both M and N are positive integers greater than 1.

The sub-pixels in the pixel units of the existing display panel have two arrangement modes. A first arrangement mode is strip arrangement, namely the first sub-pixel, the second sub-pixel and the third sub-pixel in the pixel units are arranged side by side, the first sub-pixel, the second sub-pixel and the third sub-pixel in each column of pixel units are respectively connected to one data line, and all sub-pixels in each column of pixel units share one sensing line; thus, as for the display panel adopting the first arrangement mode, the amount of data lines and sensing lines is 4×M. A second arrangement mode is square arrangement, each column of pixel units are respectively connected to two data lines, and all sub-pixels in each column of pixel units share one sensing line; thus, as for the display panel adopting the second arrangement mode, the amount of data lines and sensing lines is 3×M.

In the embodiments of the present disclosure, because all sub-pixels in the same column of pixel units 10 are connected to the same data line, each column of pixel units 10 are connected to two sensing lines respectively, and any two adjacent columns of pixel units 10 share one sensing line, the amount of data lines and sensing lines in the display panel provided by the embodiments of the present disclosure is 2×M+1.

Because 2×M+1<3×M<4×M, the display panel provided by the embodiments of the disclosure can greatly reduce the amount of data lines and sensing lines, thereby reducing hardware cost and bonding difficulty and improving bonding yield in the case where a source driving chip is connected to the data lines and sensing lines in the display panel by COF.

For example, a resolution of an 8K display panel is 7680×4320, that is, the display panel includes 7680×4320 pixel units 10. The amount of data lines and sensing lines in the existing display panel adopting the first arrangement mode is 7680×4=30720, and the amount of data lines and sensing lines in the existing display panel adopting the second arrangement mode is 7680×3=23040, while the amount of data lines and sensing lines in the display panel provided by the embodiments of the present disclosure is 7680×2+1=15361. Thus, it can be seen that the amount of data lines and sensing lines is significantly reduced.

Therefore, it can be seen that the amount of data lines and sensing lines in the display panel according to the embodiments of the present disclosure is less than the amount of data lines and sensing lines in the existing display panel, so that the amount of data lines and sensing lines in the display panel is reduced. In the case where the source driving chip is subsequently connected to the data lines and sensing lines in the display panel by COF, the amount of signal transmission lines which need to be designed on the circuit board and the COF is correspondingly reduced, so that the hardware cost of the circuit board and the COF is reduced, and the bonding difficulty is also reduced when COF is used for bonding, and further, the bonding yield is improved.

In addition, in the case where the amount of data lines and sensing lines in the display panel is large, an amount of the required pins of the source driving chip is also large, thus increasing the cost of the source driving chip. Therefore, the reduction in the amount of data lines and sensing lines in the display panel provided by the embodiments of the present disclosure can also lead to a reduction of the amount of the required pins of the source driving chip, thereby reducing the cost of the source driving chip.

It should be noted that the amount of sub-pixels in each pixel unit 10 is not merely limited to three as shown in FIG. 1B (i.e., the first sub-pixel 11, the second sub-pixel 12, and the third sub-pixel 13). And each pixel unit 10 can also include a plurality of sub-pixels, for example, each pixel unit 10 can also include 4 sub-pixels, etc.

In some embodiments of the present disclosure, the display panel 110 further includes gate line groups connected to the sub-pixels. Each row of pixel units 10 are respectively connected to two of the gate line groups, and any two adjacent rows of pixel units 10 share one of the gate line groups, and each of the gate line groups includes a first gate line and a second gate line, such as a first gate line G1_<n−1>, a first gate line G1_<n>, a first gate line G1_<n+1>, a first gate line G1_<n+2>, a second gate line G2_<n−1>, a second gate line G2_<n>, a second gate line G2_<n+1>, and a second gate line 21_<n+2>, as shown in FIG. 1B. For example, in the present example, n is an integer greater than 2.

Among them, the first gate line G1_<n−1> and the second gate line G2_<n−1> form a gate line group, the first gate line G1_<n> and the second gate line G2_<n> form a gate line group, the first gate line G1_<n+1> and the second gate line G2_<n+1> form a gate line group, and the first gate line G1_<n+2> and the second gate line G2_<n+2> form a gate line group.

As shown in FIG. 1B, from top to bottom, an (n−1)-th row of pixel units 10, an (n)-th row of pixel units 10, and an (n+1)-th row of pixel units 10 are located, the (n−1)-th row of pixel units 10 are respectively connected to the gate line group including the first gate line G1_<n−1> and the second gate line G2_<n−1> and the gate line group including the first gate line G1_<n> and the second gate line G2_<n>, the (n)-th row of pixel units 10 are respectively connected to the gate line group including the first gate line G1_<n> and the second gate line G2_<n> and the gate line group including the first gate line G1_<n+1> and the second gate line G2_<n+1>, and the (n+1)-th row of pixel units 10 are respectively connected to the gate line group including the first gate line G1_<n+1> and the second gate line G2_<n+1> and the gate line group including the first gate line G1_<n+2> and the second gate line G2_<n+2>. Therefore, it can be seen that the (n)-th row of pixel units 10 and the (n−1)-th row of pixel units 10 share the gate line group including the first gate line G1_<n> and the second gate line G2_<n>, and the (n)-th row of pixel units 10 and the (n+1)-th row of pixel units 10 share the gate line group including the first gate line G1_<n+1> and the second gate line G2_<n+1>.

In the case where the display panel 110 includes M×N pixel units 10 (that is, the resolution of the display panel 110 is M×N), an amount of gate lines in the display panel 110 provided by the embodiments of the present disclosure is 2×N+2, while the amount of gate lines in the existing display panel is 2×N. Therefore, the amount of gate lines in the display panel provided by the embodiments of the present disclosure is two more than the amount of gate lines in the existing display panel, that is, the increase of the amount of gate lines is very little and is basically negligible. Therefore, the embodiments of the present disclosure can reduce the amount of data lines and sense lines on the basis of basically not increasing the amount of gate lines, thereby simplifying the wiring design of display panel.

Of course, the embodiments of the present disclosure are not limited to this case, and the wiring manner in the display panel can also be designed such that each row of pixel units 10 are connected to two gate line groups respectively, and the gate line groups connected to any two adjacent rows of pixel units 10 are not shared a same gate line group. Therefore, in the case where the display panel includes M×N pixel units 10, the amount of gate lines in the display panel is 4×N. If the display panel provided by the embodiments of the present disclosure adopts a GOA (Gate driver On Array) design, although the amount of gate lines is increased, the bonding difficulty of the display panel will not be affected because the gate lines do not need to be bonded to a gate driving chip.

As shown in FIG. 1B, the display panel 110 includes M×N pixel units 10, and each pixel unit 10 includes a first sub-pixel 11, a second sub-pixel 12, and a third sub-pixel 13; a first sub-pixel 11 of the pixel unit 10 in the (n)-th row and the (m)-th column is connected to the first gate line G1_<n> in the (n)-th row, the second gate line G2_<n> in the (n)-th row, the sense line Sm in the (m)-th column and the data line Dm in the (m)-th column, respectively; a second sub-pixel 12 of the pixel unit 10 in the (n)-th row and the (m)-th column is connected to the first gate line G1_<n+1> in the (n+1)-th row, the second gate line G2_<n+1> in the (n+1)-th row, the sense line Sm+1 in the (m+1)-th column, and the data line Dm in the (m)-th column, respectively; and a third sub-pixel 13 of the pixel unit 10 in the (n)-th row and the (m)-th column is connected to the first gate line G1_<n> in the (n)-th row, the second gate line G2_<n+1> in the (n+1)-th row, the sense line Sm in the (m)-th column, and the data line Dm in the (m)-th column, respectively. For example, M represents an amount of the pixel units in a column direction, N represents an amount of the pixel units in a row direction, 1≤n≤N, 1≤m≤M, and both M and N are positive integers greater than 1. In addition, n and m are positive integers.

For example, in some embodiments of the present disclosure, a color of light emitted by the first sub-pixels 11 in the (n)-th row of pixel units 10 is identical to a color of light emitted by the second sub-pixels 12 in the (n+1)-th row of pixel units 10, and a color of light emitted by the second sub-pixels 12 in the (n)-th row of pixel units 10 is identical to a color of light emitted by the first sub-pixels 11 in the (n+1)-th row of pixel units 10; and colors of light emitted by third sub-pixels 13 in respective pixel units 10 are identical to each other.

Because the first sub-pixels 11 in the (n)-th row of pixel units 10 and the second sub-pixels 12 in the (n−1)-th row of pixel units 10 share the gate line group including the first gate line G1_<n> and the second gate line G2_<n>, and the second sub-pixels 12 in the (n)-th row of pixel units 10 and the first sub-pixels 11 in the (n+1)-th row of pixel units 10 share the gate line group including the first gate line G1_<n+1> and the second gate line G2_<n+1>, in an actual display process of the pixel units 10, in order to ensure the normal display of all sub-pixels in the pixel units 10, the first sub-pixels 11 in the (n)-th row of pixel units 10 and the second sub-pixels in the (n−1)-th row of pixel units 10 need to display simultaneously, and the second sub-pixels in the (n)-th row of pixel units 10 and the first sub-pixels in the (n+1)-th row of pixel units 10 need to display simultaneously. And Because all sub-pixels in a same column of pixel units 10 are connected to a same data line, and the data line can only input one data voltage in a same time period, it is necessary to set the color of light emitted by the first sub-pixels 11 in the (n)-th row of pixel units 10 and the color of light emitted by the second sub-pixels 12 in the (n−1)-th row of pixel units 10 to be the same, and to set the color of light emitted by the second sub-pixels 12 in the (n)-th row of pixel units 10 and the color of light emitted by the first sub-pixels 11 in the (n+1)-th row of pixel units 10 to be the same.

The colors of the light emitted by the third sub-pixels 13 in the respective pixel units 10 are identical to each other, and the third sub-pixels 13 do not display at the same time as other sub-pixels in the actual display process of the pixel units 10.

For example, the first sub-pixels 11 in the (n)-th row of pixel units 10 are green sub-pixels, the second sub-pixels 12 in the (n)-th row of pixel units 10 are red sub-pixels, and the third sub-pixels 13 in the (n)-th row of pixel units 10 are blue sub-pixels. In this case, the first sub-pixels 11 in the (n+1)-th row of pixel units 10 are red sub-pixels, the second sub-pixels 12 in the (n+1)-th row of pixel units 10 are green sub-pixels, and the third sub-pixels in the (n+1)-th row of pixel units 10 are blue sub-pixels.

In addition, the color of light emitted by the first sub-pixel 11, the color of light emitted by the second sub-pixel 12 and the color of light emitted by the third sub-pixel 13 are different from each other in each of the plurality of pixel units 10.

In order to ensure that the pixel unit 10 can emit light of various colors, the color of light emitted by the first sub-pixel 11, the color of light emitted by the second sub-pixel 12 and the color of light emitted by the third sub-pixel 13 in the pixel unit 10 need to be set to be different. For example, the color of the light emitted by the first sub-pixel 11, the color of light emitted by the second sub-pixel 12 and the color of light emitted by the third sub-pixel 13 are red, green and blue, respectively. It should be noted that the embodiments of the present disclosure are not limited to this case, the specific setting of the color of each sub-pixel in each pixel unit can be set according to the above description and details will not be repeated herein.

Figure 1C:
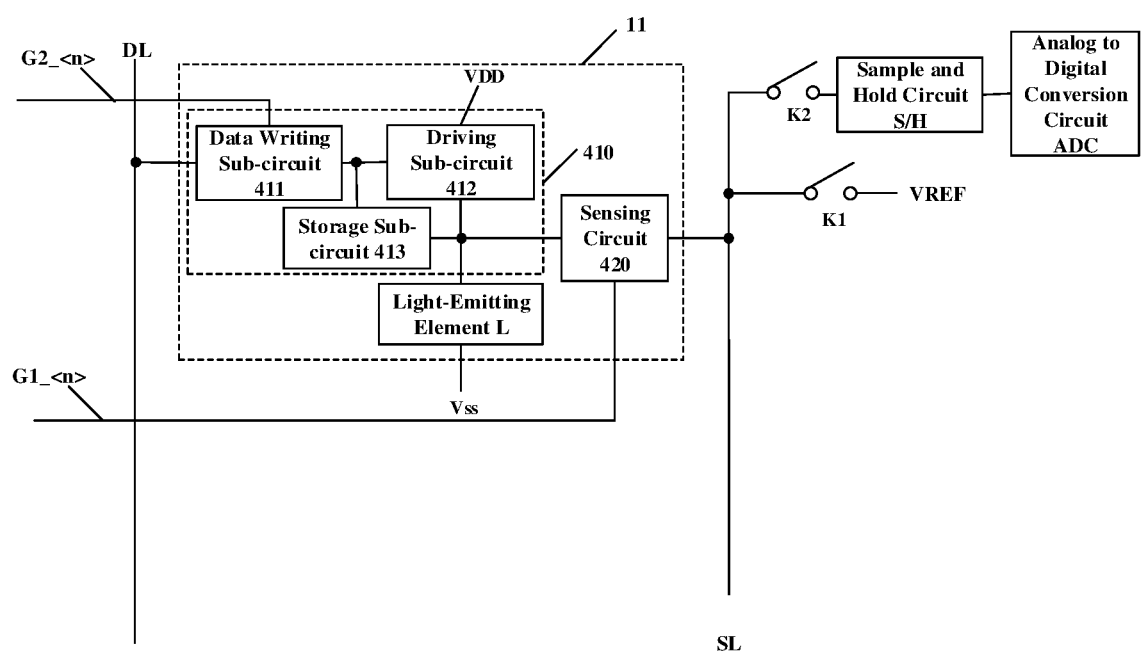
FIG. 1C is a structural schematic diagram of a sub-pixel provided by at least one embodiment of the present disclosure.

FIG. 1C shows a structural schematic diagram of a sub-pixel provided by at least one embodiment of the present disclosure.

In the embodiments of the present disclosure, each sub-pixel includes a light-emitting element L, a pixel driving circuit 410 configured for driving the light-emitting element to emit light, and a sensing circuit 420 configured for sensing the pixel driving circuit 410. For example, in the embodiments of the present disclosure, a first sub-pixel 11 in the (n)-th row of pixel units is taken as an example for description, and the structures of other sub-pixels are similar thereto, and details will not be described again.

For example, as shown in FIG. 1C, in some examples, the pixel driving circuit 410 includes a data writing sub-circuit 411 and a driving sub-circuit 412; and in some other examples, the pixel driving circuit 410 further includes a storage sub-circuit 413.

For example, in a display period of one frame, the pixel driving circuit 410 in the first sub-pixel 11 can drive the light-emitting element L to emit light; in a blanking period of one frame, the sensing circuit 420 in the first sub-pixel 11 can sense the pixel driving circuit 410, so that an external compensation for the first sub-pixel 11 can be realized according to the sensing result.

For example, the driving sub-circuit 412 is connected to the data writing sub-circuit 411, a parasitic capacitance (not shown in the figure) or the storage sub-circuit 413, the light-emitting element L, and the sensing circuit 420, and is configured to control a driving current for driving the light-emitting element L to emit light. For example, in a light-emitting stage, the driving sub-circuit 412 can supply a driving current to the light-emitting element L to drive the light-emitting element L to emit light, that is, to emit light according to a desired "grayscale" (i.e., data voltage).

For example, the data writing sub-circuit 411 is further connected to a parasitic capacitance (not shown in the figure) or a storage sub-circuit 413, and is configured to receive a scan driving signal and to write a data voltage to the driving sub-circuit 412 in response to the scan driving signal. For example, the data writing sub-circuit 411 is connected to the gate line G2_<n> to receive the scan driving signal, and the data writing sub-circuit 411 can be turned on in response to the scan driving signal. For example, the data writing sub-circuit 411 of the first sub-pixel 11 of the pixel unit in the (n)-th row and the (m)-th column can be further connected to the data line Dm to receive the data voltage and to write the data voltage to the driving sub-circuit 412 in the case where the data writing sub-circuit 411 is turned on. For example, in different stages, the data voltage received by the data writing sub-circuit 411 can be a compensated data voltage for the first sub-pixel 11 to emit light, or can be a data voltage for any other sub-pixel to emit light, without being limited in the embodiments of the present disclosure.

For example, the sensing circuit 420 is further connected to the parasitic capacitance (not shown in the figure) or the storage sub-circuit 413, and the light-emitting element L, and is configured to receive the scan driving signal, and to write a reference voltage signal (e.g., at a low level) to the driving sub-circuit 412 or to read a sensing voltage signal from the driving sub-circuit 412 in response to the scan driving signal. For example, taking a first sub-pixel 11 of the pixel units in the (n)-th row as an example, the sensing circuit 420 is connected to the gate line G1_<n> to receive the scan driving signal, and the sensing circuit 420 can be turned on in response to the scan driving signal. For example, the sensing circuit 420 of the first sub-pixel 11 of the pixel unit in the (n)-th row and the (m)-th column can further be connected to the sensing line Sm. For example, in the case where the sensing circuit 420 is turned on, the sensing circuit 420 can write the reference voltage signal received through the sensing line Sm to the driving sub-circuit 412, or the sensing circuit 420 can also output the sensing voltage signal read from the driving sub-circuit 412 through the sensing line Sm.

For example, as shown in FIG. 1C, the display panel 110 provided by the embodiments of the present disclosure can further include a sample-and-hold circuit S/H, an analog-to-digital conversion circuit ADC, a first switch K1, and a second switch K2. For example, in the case where a reference voltage signal needs to be written through the sensing line Sm, the first switch K1 is closed and the second switch K2 is turned off. For another example, in the case where a sensing voltage signal needs to be read through the sensing line Sm, the first switch K1 is turned off and the second switch K2 is closed.

For example, the sample-and-hold circuit S/H is configured to sample and hold the sensing voltage signal. The analog-to-digital conversion circuit ADC is connected to the sample-and-hold circuit S/H, and is configured to perform analog-to-digital conversion (analog signal to digital signal) on the sensing voltage signal which is sampled and held for further performing a subsequent data processing. For example, compensation information related to a threshold voltage Vth and a current coefficient K of the driving sub-circuit 412 can be obtained by processing the sensing voltage signal. For example, in a blanking period of a certain frame, a sensing voltage signal can be obtained by the sensing circuit 420, and the data processing is further performed on the sensing voltage signal to obtain compensation information related to the threshold voltage Vth and the current coefficient K; then, in a display period of a next frame, the light-emitting element L is driven again according to the compensation information obtained above, thereby completing the external compensation for the first sub-pixel 11 of the pixel units in the (n)-th row. A specific compensation method can be referred to the methods in the art and details will not be described herein.

For example, as shown in FIG. 1C, the storage sub-circuit 413 is further connected to the light-emitting element L and is configured to store the data voltage being written and the reference voltage signal. For example, in the case where the data voltage is written into the driving sub-circuit 412 through the data writing sub-circuit 411, the storage sub-circuit 413 can store the data voltage at the same time. For another example, in the case where the reference voltage signal is written into the driving sub-circuit 412 by the sensing circuit 420, the storage sub-circuit 413 can store the reference voltage signal at the same time.

Figure 2:
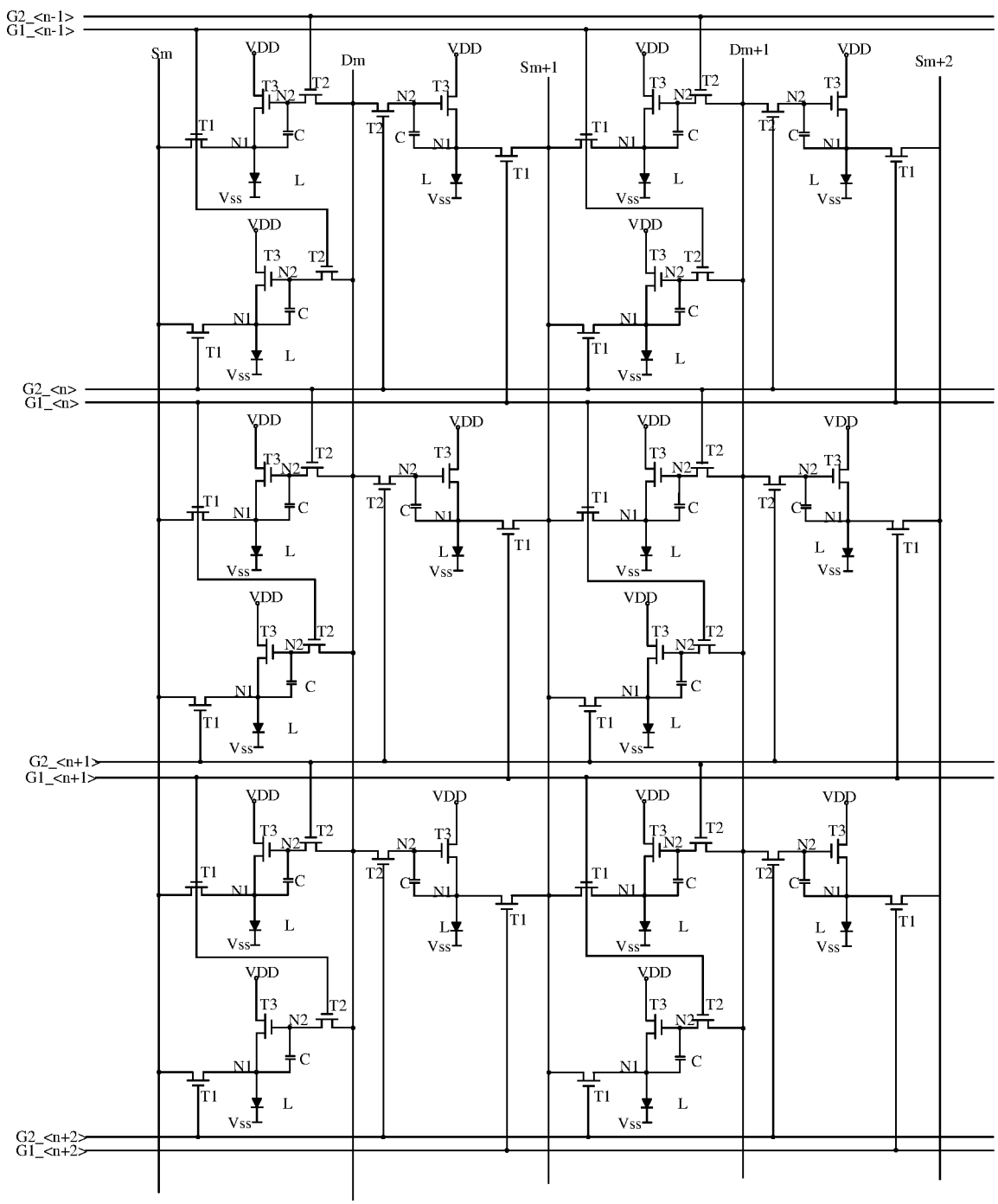
FIG. 2 is a circuit diagram of a display panel provided by at least one embodiment of the present disclosure.
Figure 3:
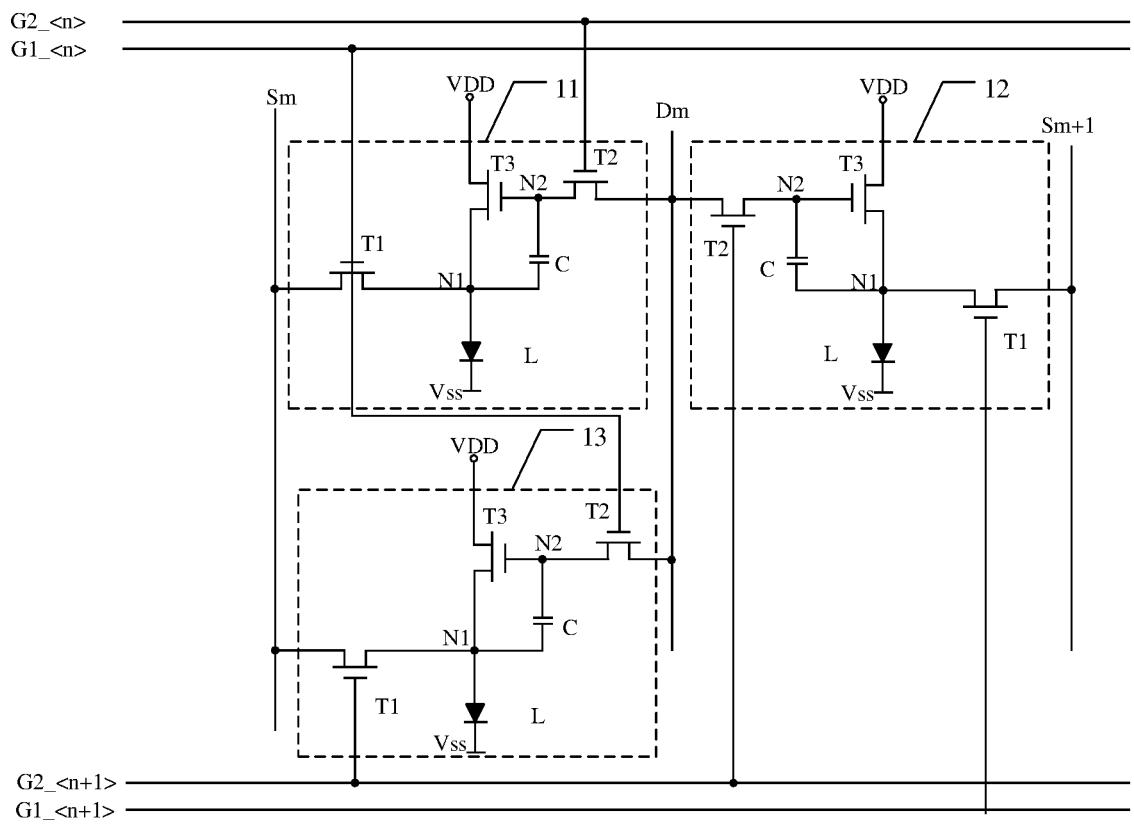
FIG. 3 is a schematic partial view of one pixel unit as shown in FIG. 2.

FIG. 2 shows a circuit diagram of a display panel provided by at least one embodiment of the present disclosure, and FIG. 3 shows a schematic partial view of a pixel unit as shown in FIG. 2. As shown in FIG. 2 and FIG. 3, in the display panel 110 provided by some embodiments of the present disclosure, each pixel unit 10 can be implemented as a circuit structure as shown in FIG. 3.

For example, the sensing circuit 420 can be implemented as a first transistor T1, the data writing sub-circuit 411 can be implemented as a second transistor T2, the driving sub-circuit 412 can be implemented as a driving transistor T3, and the storage sub-circuit 413 can be implemented as a storage capacitor C. The transistors in the sub-pixel will be described in detail below by taking the first sub-pixel 11 of the pixel unit 10 in the (n)-th row and the (m)-th column as an example. The structures of other sub-pixels are similar to that of the first sub-pixel 11 of the pixel unit 10 in the (n)-th row and the (m)-th column, and details will not be described again.

For example, for the first sub-pixel 11 of the pixel unit 10 in the (n)-th row and the (m)-th column, a gate electrode of the first transistor T1 is connected to the first gate line G1_<n> in the (n)-th row, and a first electrode of the first transistor T1 is connected to the sensing line Sm in the (m)-th column, a gate electrode of the second transistor T2 is connected to the second gate line G2_<n> in the (n)-th row, and a first electrode of the second transistor T2 is connected to the data line Dm in the (m)-th column. For the second sub-pixel 12 of the pixel unit 10 in the (n)-th row and the (m)-th column, a gate electrode of the first transistor T1 is connected to the first gate line G1_<n+1> in the (n+1)-th row, and a first electrode of the first transistor T1 is connected to the sensing line Sm+1 in the (m+1)-th column, a gate electrode of the second transistor T2 is connected to the second gate line G2_<n+1> in the (n+1)-th row, and a first electrode of the second transistor T2 is connected to the data line Dm in the (m)-th column. For the third sub-pixel 13 of the pixel unit 10 in the (n)-th row and the (m)-th column, a gate electrode of the first transistor T1 is connected to the second gate line G2_<n+1> in the (n+1)-th row, and a first electrode of the first transistor T1 is connected to the sensing line Sm in the (m)-th column, a gate electrode of the second transistor T2 is connected to the first gate line G1_<n> in the (n)-th row, and a first electrode of the second transistor T2 is connected to the data line Dm in the (m)-th column.

For any one of the sub-pixels, a second electrode of the first transistor T1 is connected to a first terminal N1 of the storage capacitor C, a second electrode of the second transistor T2 is connected to a second terminal N2 of the storage capacitor C, a gate electrode of the driving transistor T3 is connected to the second electrode of the second transistor T2, a first electrode of the driving transistor T3 is connected to an anode of the light-emitting element L, a second electrode of the driving transistor T3 is connected to a first voltage terminal VDD to receive a first voltage (e.g., at a high level), the first terminal N1 of the storage capacitor C is further connected to the anode of the light-emitting element L, and a cathode of the light-emitting element L is connected to a second voltage terminal Vss to receive a second voltage (e.g., at a low level, lower than the first voltage).

For example, the first transistor T1, the second transistor T2, and the driving transistor T3 are all N-type transistors. Of course, the first transistor T1, the second transistor T2, and the driving transistor T3 can also be P-type transistors.

It should be noted that in some embodiments of the present disclosure, the high level and the low level are relative to each other. The high level indicates a higher voltage range (for example, the high level can adopt 5V, 10V or any other suitable voltage), and the plurality of high levels may be the same or different. Similarly, the low level indicates a lower voltage range (for example, a low level may adopt 0V, −5V, −10V or any other suitable voltage), and the plurality of low levels may be the same or different. For example, a minimum value of the high level is greater than a maximum value of the low level.

The transistors adopted in the embodiments of the present disclosure can be thin film transistors or field effect transistors or other switching elements having the same characteristics, and the embodiments of the present disclosure are all described by taking thin film transistors as an example. A source electrode and drain electrode of the transistor used here can be symmetrical in structure, so the source electrode and drain electrode can be structurally indistinguishable. In the embodiments of the present disclosure, in order to distinguish these two electrodes of the transistor other than a gate electrode, one electrode is directly described as a first electrode and the other electrode is described as a second electrode.

In addition, the transistors can be divided into N-type transistors and P-type transistors according to the characteristics thereof. In the case where the transistor is a P-type transistor, a turn-on voltage is a low-level voltage (e.g., 0V, −5V, −10V or any other suitable voltage), and a turn-off voltage is a high-level voltage (e.g., 5V, 10V or any other suitable voltage); in the case where the transistor is an N-type transistor, a turn-on voltage is a high-level voltage (e.g., 5V, 10V or any other suitable voltage), and a turn-off voltage is a low-level voltage (e.g., 0V, −5V, −10V or any other suitable voltage).

It should be noted that only 3 rows and 2 columns of pixel units are schematically as shown in FIG. 1B and FIG. 2 for description, and more pixel units can be included. A specific setting can be set according to actual conditions, without being limited in the embodiments of the present disclosure.

Figure 4:
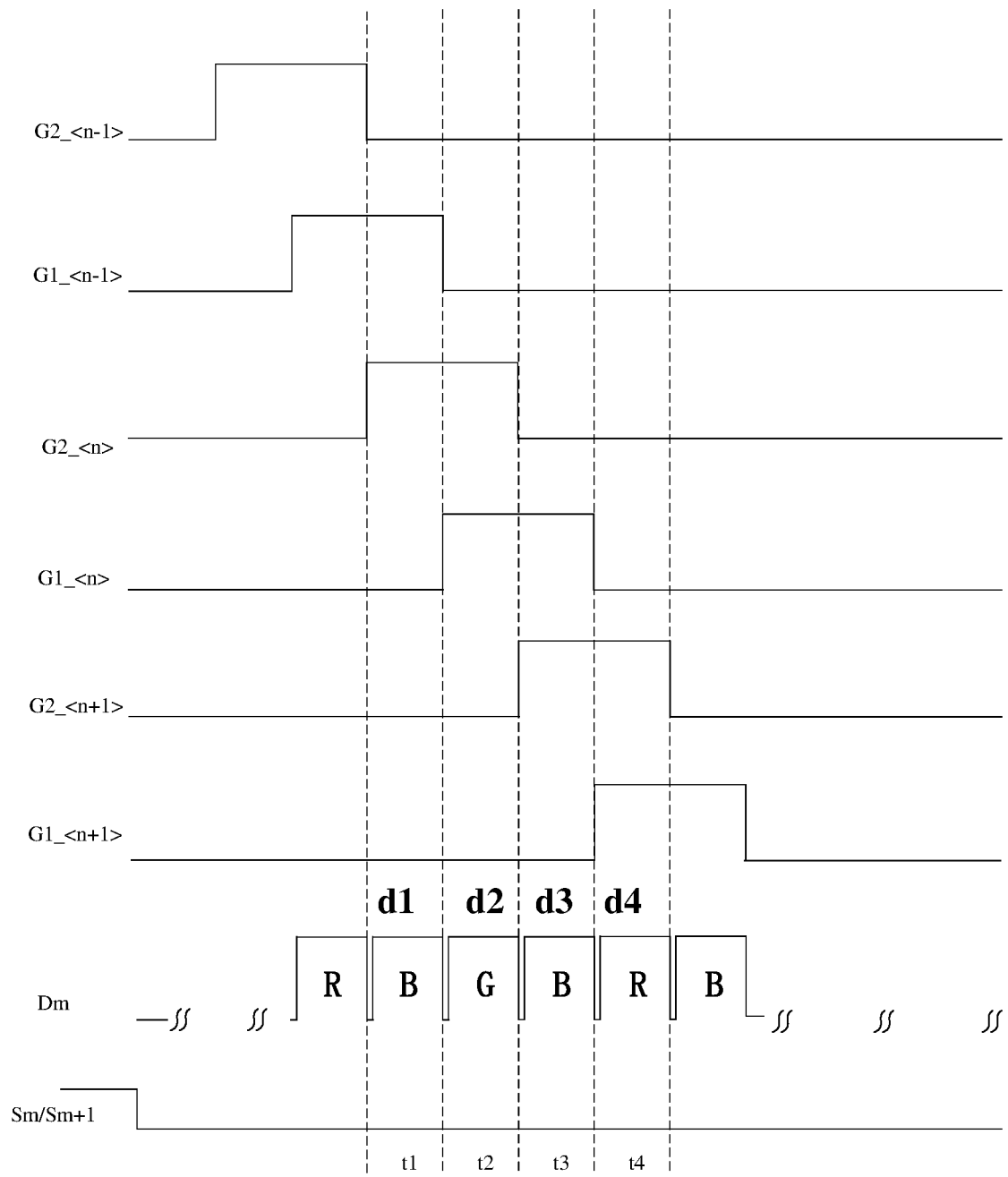
FIG. 4 is a driving timing chart of a display panel provided by at least one embodiment of the present disclosure.

FIG. 4 shows a driving timing chart of a display panel provided by at least one embodiment of the present disclosure.

Hereinafter, a specific operation process of the display panel 110 as shown in FIG. 2 in the display period will be illustrated by taking a case that the first sub-pixel 11 of the pixel unit 10 in the (n)-th row and the (m)-th column is a green sub-pixel, the second sub-pixel 12 of the pixel unit 10 in the (n)-th row and the (m)-th column is a red sub-pixel, and the third sub-pixel 13 of the pixel unit 10 in the (n)-th row and the (m)-th column is a blue sub-pixel as an example.

The driving timing chart as shown in FIG. 4 is a timing chart of the display panel 110 in the display period, and the signal input from the sensing line Sm is the reference voltage signal, and e.g., the reference voltage signal is at a low level.

In a first time period t1, the scan driving signals input from the first gate line G1_<n−1> in the (n−1)-th row and the second gate line G2_<n> in the (n)-th row are both at a high level, and the first transistors T1 and the second transistors T2 of the third sub-pixels 13 in the (n−1)-th row of pixel units 10 are controlled to be turned on. At this time, the data voltage input from the data line Dm is a data voltage d1 required by the third sub-pixel 13 (i.e., the blue sub-pixel B) of the pixel unit 10 in the (n−1)-th row and the (m)-th column, then the data voltage d1 is written into the second terminal N2 of the storage capacitor C of the third sub-pixel 13 of the pixel unit 10 in the (n−1)-th row and the (m)-th column. Because the sensing signal input from the sensing line Sm in the (m)-th column is at a low level, which is used to reset the first terminal N1 of the storage capacitor C of the third sub-pixel 13 of the pixel unit 10 in the (n−1)-th row and the (m)-th column, so the anode of the light-emitting element L of the third sub-pixel 13 of the pixel unit 10 in the (n−1)-th row and the (m)-th column is at a low level, and at this time, the light-emitting element L of the third sub-pixel 13 of the pixel unit 10 in the (n−1)-th row and the (m)-th column does not emit light.

In the first time period t1, the second transistor T2 of the first sub-pixel 11 of the pixel unit 10 in the (n)-th row and the (m)-th column is turned on in response to the scan driving signal input from the second gate line G2_<n> in the (n)-th row, and writes the data voltage d1 into the storage capacitor C, that is, the voltage of the anode N1 of the light-emitting element L is a voltage of the data voltage d1. For example, in the case where the first sub-pixel 11 of the pixel unit 10 in the (n)-th row and the (m)-th column emits light in a previous frame, the voltage of the gate electrode N1 of the third transistor T3 of the first sub-pixel 11 of the pixel unit 10 in the (n)-th row and the (m)-th column is higher than the voltage of the data voltage d1, and the voltage of the data voltage d1 does not reach the voltage that causes the light-emitting element L to emit light, therefore, the light-emitting element L of the first sub-pixel 11 of the pixel unit 10 in the (n)-th row and the (m)-th column does not emit light in the first time period t1; in the case where the first sub-pixel 11 of the pixel unit 10 in the (n)-th row and the (m)-th column does not emit light in the previous frame, that is, the voltage of the gate electrode N1 of the third transistor T3 of the first sub-pixel 11 of the pixel unit 10 in the (n)-th row and the (m)-th column is 0, or a voltage of the gate electrode N1 of the third transistor T3 of the first sub-pixel 11 of the pixel unit 10 in the (n)-th row and the (m)-th column is less than the voltage of the data voltage d1, even if the light-emitting element L of the first sub-pixel 11 of the pixel unit 10 in the (n)-th row and the (m)-th column emits light, the light emitted by the data voltage d1 may not be perceived by human eyes because the writing time of the data voltage d1 (i.e., the first time period t1) is extremely short, and immediately a second time period t2 is entered. As described below, a data voltage d2 used to control the first sub-pixel 11 of the pixel unit 10 in the (n)-th row and the (m)-th column is written in the second time period t2, so that the data voltage stored in the storage capacitor C is updated to a required data voltage thereof, and thus the display of the display panel will not be affected. The case of the first sub-pixel 11 in any other pixel unit is similar thereto and details will not be described again.

In the second time period t2, the scan driving signals input from the second gate line G2_<n> in the (n)-th row and the first gate line G1_<n> in the (n)-th row are both at a high level, the first transistors T1 and the second transistors T2 of the second sub-pixels 12 of the pixel units 10 in the (n)-th row are controlled to be turned on, and the first transistors T1 and the second transistors T2 of the first sub-pixels 11 of the pixel unit 10 in the (n)-th row are controlled to be turned on. At this time, the data voltage input from the data line Dm is the data voltage d2 required by the second sub-pixel 12 (i.e., the green sub-pixel G) of the pixel unit 10 in the (n−1)-th row and the (m)-th column and the first sub-pixel 11 (i.e., the green sub-pixel G) of the pixel unit 10 in the (n)-th row and the (m)-th column, then the data voltage d2 is written into the second terminal N2 of the storage capacitor C of the second sub-pixel 12 of the pixel unit 10 in the (n−1)-th row and the (m)-th column and into the second terminal N2 of the storage capacitor C of the first sub-pixel 11 of the pixel unit 10 in the (n)-th row and the (m)-th column, respectively. And because the sensing signals input from the sensing line Sm in the (m)-th column and the sensing line Sm+1 in the (m+1)-th column are both at a low level, at this time, neither the second sub-pixel 12 of the pixel unit 10 in the (n−1)-th row and the (m)-th column nor the first sub-pixel 11 of the pixel unit 10 in the (n)-th row and the (m)-th column emits light.

Meanwhile, because the scan driving signal input from the second gate line G2_<n> in the (n)-th row is at a high level, the first transistor T1 of the third sub-pixel 13 of the pixel unit 10 in the (n−1)-th row and the (m)-th column is still in a turn-on state, and the light-emitting element L of the third sub-pixel 13 of the pixel unit 10 in the (n−1)-th row and the (m)-th column still does not emit light.

In a third time period t3, the scan driving signals input from the first gate line G1_<n−1> in the (n−1)-th row and the second gate line G2_<n> in the (n)-th row are both at a low level, so that the first transistors T1 and the second transistors T2 of the third sub-pixels 13 of the pixel units 10 in the (n−1)-th row are all turned off. Under the action of the storage capacitor C of the third sub-pixel 13 of the pixel unit 10 in the (n−1)-th row and the (m)-th column, the driving transistor T3 of the third sub-pixel 13 of the pixel unit 10 in the (n−1)-th row and the (m)-th column is turned on, so that the light-emitting element L of the third sub-pixel 13 of the pixel unit 10 in the (n−1)-th row and the (m)-th column emits light of a corresponding "grayscale" according to the data voltage stored by the storage capacitor C.

Meanwhile, the scan driving signals input from the first gate line G1_<n> in the (n)-th row and the second gate line G2_<n+1> in the (n+1)-th row are both at a high level, and the first transistors T1 and the second transistors T2 of the third sub-pixels 13 of the pixel unit 10 in the (n)-th row are turned on. At this time, the data voltage input from the data line Dm is a data voltage d3 required by the third sub-pixel 13 (i.e., the blue sub-pixel B) of the pixel unit 10 in the (n)-th row and the (m)-th column. Because the sensing signal input from the sensing line Sm in the (m)-th column is at a low level, the light-emitting element L of the third sub-pixel 13 of the pixel unit 10 in the (n)-th row and the (m)-th column does not emit light.

In a fourth time period t4, the scan driving signals input from the second gate line G2_<n> in the (n)-th row and the first gate line G1_<n> in the (n)-th row are both at a low level, so that the first transistors T1 and the second transistors T2 of the second sub-pixels 12 of the pixel units 10 in the (n)-th row are turned off, and the first transistors T1 and the second transistors T2 of the first sub-pixels 11 of the pixel units 10 in the (n)-th row are turned off. Under the action of the storage capacitor C of the second sub-pixel 12 of the pixel unit 10 in the (n−1)-th row and the (m)-th column, the driving transistor T3 of the second sub-pixel 12 of the pixel unit 10 in the (n−1)-th row and the (m)-th column is turned on, so that the light-emitting element L of the second sub-pixel 12 of the pixel unit 10 in the (n−1)-th row and the (m)-th column emits light of a corresponding "grayscale" according to the data voltage stored in the storage capacitor C. And under the action of the storage capacitor C of the first sub-pixel 11 of the pixel unit 10 in the (n)-th row and the (m)-th column, the driving transistor T3 of the first sub-pixel 11 of the pixel unit 10 in the (n)-th row and the (m)-th column is turned on, so that the light-emitting element L of the first sub-pixel 11 of the pixel unit 10 in the (n)-th row and the (m)-th column emits light of a corresponding "grayscale" according to the data voltage stored in the storage capacitor C.

Meanwhile, the scan driving signals input from the second gate line G2_<n+1> in the (n+1)-th row and the first gate line G1_<n+1> in the (n+1)-th row are both at a high level, the first transistors T1 and the second transistors T2 of the second sub-pixels 12 of the pixel units 10 in the (n)-th row are turned on, and the first transistors T1 and the second transistors T2 of the first sub-pixels 11 of the pixel units 10 in the (n+1)-th row are turned on. At this time, the data voltage input from the data line Dm is a data voltage d4 required by the second sub-pixel 12 (i.e., the red sub-pixel R) of the pixel unit 10 in the (n)-th row and the (m)-th column and the first sub-pixel 11 (i.e., the red sub-pixel R) of the pixel unit 10 in the (n+1)-th row and the (m)-th column. Because the sensing signals input from the sensing line Sm in the (m)-th column and the sensing line Sm+1 in the (m+1)-th column are both at a low level, at this time, neither the second sub-pixel 12 of the pixel unit 10 in the (n)-th row and the (m)-th column nor the first sub-pixel 11 of the pixel unit 10 in the (n+1)-th row and the (m)-th column emits light.

It should be noted that the above description only illustrates the specific driving methods of several pixel units 10 in the (m)-th column, and it can be understood that the above driving methods can be correspondingly referred to for other pixel units 10 in the display panel.

Figure 5:
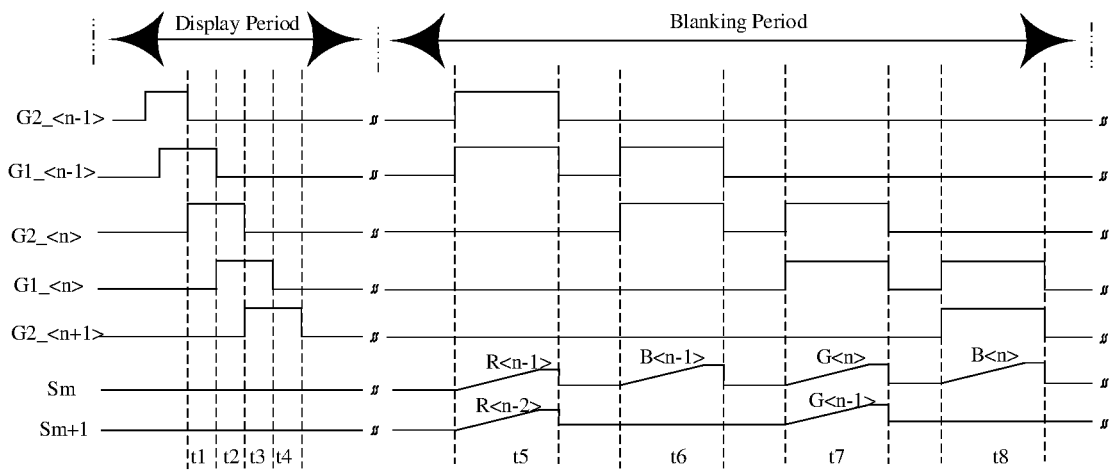
FIG. 5 is a timing chart of a display panel in a display period and a blanking period provided by at least one embodiment of the present disclosure.

Referring to FIG. 5, a timing chart of a display panel according to an embodiment of the present disclosure in a display period and a blanking period is shown.

Hereinafter, a specific operation process of the display panel 110 as shown in FIG. 2 in the display period and the blanking period will be illustrated by taking the case that the first sub-pixel 11 of the pixel unit 10 in the (n)-th row and the (m)-th column is a green sub-pixel, the second sub-pixel 12 of the pixel unit 10 in the (n)-th row and the (m)-th column is a red sub-pixel and the third sub-pixel 13 of the pixel unit 10 in the (n)-th row and the (m)-th column is a blue sub-pixel as an example. The display period includes a first time period t1, a second time period t2, a third time period t3 and a fourth time period t4, and the blanking period includes a fifth time period t5, a sixth time period t6, a seventh time period t7, and an eighth time period t8.

In the fifth time period t5, the scan driving signals input from the second gate line G2_<n−1> in the (n−1)-th row and the first gate line G1_<n−1> in the (n−1)-th row are both at a high level, the first transistors T1 and the second transistors T2 of the first sub-pixels 11 (i.e., the red sub-pixel R<n−1>) of the pixel units 10 in the (n−1)-th row are controlled to be turned on, and the first transistors T1 and the second transistors T2 of the second sub-pixels 12 (i.e., the red sub-pixel R<n−2>) of the pixel units 10 in the (n−2)-th row are controlled to be turned on. At this time, the sensing line Sm in the (m)-th column writes the sensing signal (e.g., a reference voltage signal Vref) to or reads the sensing voltage signal sense 1 from the first terminal N1 of the storage capacitance C of the first sub-pixel 11 of the pixel unit 10 in the (n−1)-th row and the (m)-th column, and according to the data voltage input from the data line Dm in the (m)-th column and a light emission luminance (e.g., the sensing voltage signal) of the light-emitting element L of the first sub-pixel 11 of the pixel unit 10 in the (n−1)-th row and the (m)-th column, the threshold voltage of the driving transistor T3 of the first sub-pixel 11 of the pixel unit 10 in the (n−1)-th row and the (m)-th column is calculated. Meanwhile, the sensing line Sm+1 in the (m+1)-th column writes a reference voltage signal Vref to or reads a sensing voltage signal sense 2 from the first terminal N1 of the storage capacitance C of the second sub-pixel 12 of the pixel unit 10 in the (n−2)-th row and the (m)-th column, and according to the data voltage input from the data line Dm in the (m)-th column and the light emission luminance (e.g., the sensing voltage signal) of the light-emitting element L of the second sub-pixel 12 of the pixel unit 10 in an (n−2)-th row and the (m)-th column, the threshold voltage of the driving transistor T3 of the second sub-pixel 12 of the pixel unit 10 in the (n−2)-th row and the (m)-th column is calculated.

Accordingly, in the sixth time period t6, the threshold voltage of the driving transistor T3 of the third sub-pixel 13 (i.e., the blue sub-pixel B<n−1>) of the pixel unit 10 in the (n−1)-th row and the (m)-th column is calculated; in the seventh time period t7, the threshold voltage of the driving transistor T3 of the first sub-pixel 11 (i.e., the green sub-pixel G<n>) of the pixel unit 10 in the (n)-th row and the (m)-th column and the threshold voltage of the driving transistor T3 of the second sub-pixel 12 (i.e., the green sub-pixel G<n−1>) of the pixel unit 10 in the (n−1)-th row and the (m)-th column are calculated; and in the eighth time period t8, the threshold voltage of the driving transistor T3 of the third sub-pixel 13 (i.e., the blue sub-pixel B<n>) of the pixel unit 10 in the (n)-th row and the (m)-th column is calculated.

In the actual operation process, because the duration of the blanking period is relatively short, the threshold voltages of the sub-pixels in one row or several rows of pixel units 10 are randomly calculated in each blanking period, so that magnitudes of the data voltages required to be input by the data lines can be accurately determined according to the calculated threshold voltage in a subsequent display period. Thus, the external compensation for each sub-pixel can be realized, and the display effect of the display panel can be improved.

The timing chart of the display period in FIG. 5 is similar to the timing chart as shown in FIG. 4. The specific operation process of the display panel in the display period has been described above and details will not be repeated herein.

In the embodiments of the present disclosure, the plurality of pixel units arranged in an array and the data lines and sensing lines connected to the pixel units are arranged in the display panel, and each pixel unit includes the plurality of sub-pixels; all sub-pixels in a same column of pixel units are connected to a same data line, each column of pixel units are respectively connected to two sensing lines, and any two adjacent columns of pixel units share one sensing line. By setting that all sub-pixels in a same column of pixel units are connected to a same data line, each column of pixel units are respectively connected to two sensing lines and any two adjacent columns of pixel units share one sensing line, the amount of data lines and sensing lines is reduced; and in the case where the source driving chip is subsequently connected to the data lines and sensing lines in the display panel by COF, hardware cost and bonding difficulty can be reduced, and bonding yield can be improved.

Figure 6:
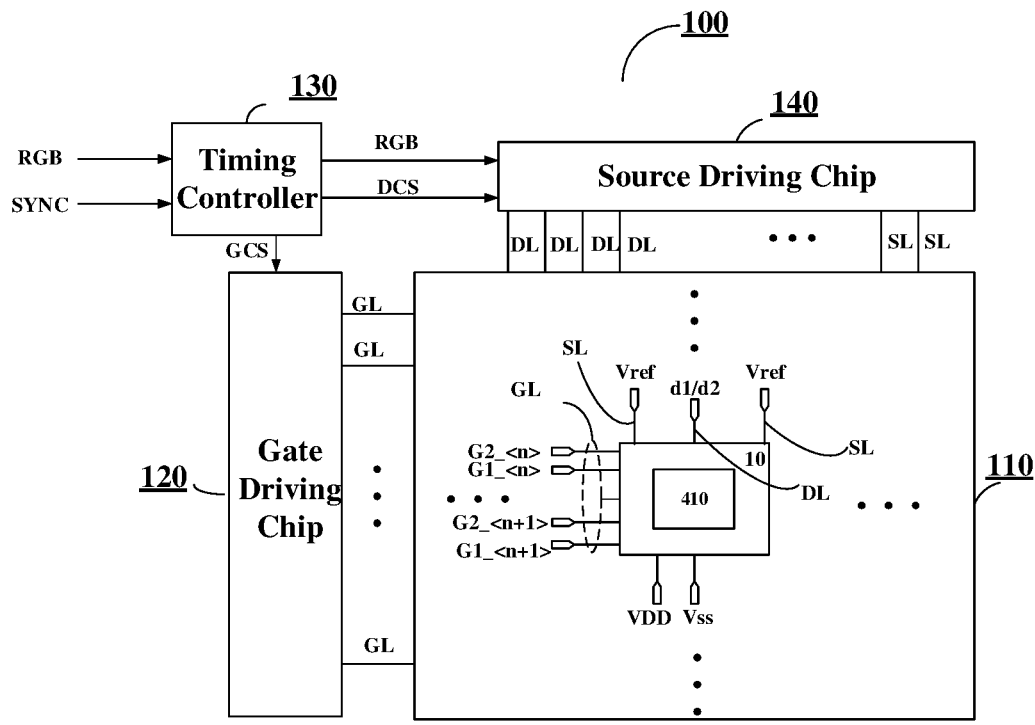
FIG. 6 is a schematic diagram of a display device provided by at least one embodiment of the present disclosure.

FIG. 6 shows a schematic diagram of a display device provided by at least one embodiment of the present disclosure. The embodiments of the present disclosure provide a display device 100, which includes the above-mentioned display panel 110.

For example, as shown in FIG. 6, the display device 100 further includes a source driving chip 140, the source driving chip 140 is connected to the data lines DL in the display panel 110 to provide the data voltages d1/d2, and the source driving chip 140 is connected to the sensing lines SL in the display panel 110 to provide the sensing signals (e.g., reference voltage signals Vref) or to receive the sensing voltage signals s1/s2.

Specifically, the source driving chip 140 is firstly fixed on a circuit board, then one side of the COF is bonded to the data lines DL and the sensing lines SL in the display panel 110, and the other side of the COF is bonded to the circuit board on which the source driving chip 140 is fixed.

For example, the display device 100 further includes a gate driving chip 120, and the gate driving chip is connected to the gate line groups (e.g., including the gate lines GL) in the display panel 110 and is configured to provide the scan driving signals G1/G2 to the pixel units 10 in the display panel 110.

As shown in FIG. 6, the display panel 110 is disposed in the display device 100 and is electrically connected to the gate driving chip 120, a timing controller 130, and the source driving chip 140. The display panel 110 includes pixel units 10 defined by crossing a plurality of gate lines GL and a plurality of data lines DL; the gate driving chip 120 is configured to drive the plurality of gate lines GL; the source driving chip 140 is configured to drive the plurality of data lines DL and the plurality of sensing lines SL; and the timing controller 130 is configured to process image data RGB input from the external of the display device 100, to provide the processed image data RGB to the source driving chip 140, and to output a gate control signal GCS and a data control signal DCS to the gate driving chip 120 and the source driving chip 140, so as to control the gate driving chip 120 and the source driving chip 140.

For example, the plurality of gate lines are connected to the corresponding data writing circuits in the pixel driving circuits of the respective sub-pixels of each row of pixel units to provide the scan driving signals, and the plurality of gate lines are further connected to the corresponding sensing circuits in the respective sub-pixels of each row of pixel units so that the scan driving signals are taken as the sensing control signals.

For example, the pixel units 10 are disposed in intersection regions of the gate lines GL and the data lines DL. For example, as shown in FIG. 6, each pixel unit 10 is connected to four gate lines GL (G2_<N> to G1_<n+1>) (respectively providing scan driving signals), one data line DL, two sensing lines SL, a second voltage line configured for providing the second voltage Vss, and a first voltage line configured for providing the first voltage VDD. For example, the first voltage line or the second voltage line can be replaced with a corresponding plate-shaped common electrode (e.g., a common anode or a common cathode). It should be noted that only part of the pixel units 10, part of the gate lines GL, and part of the data lines DL are shown in FIG. 6.

For example, the data line DL of each column is connected to the data writing sub-circuit of each sub-pixel of the pixel circuits 10 in each column to provide a data signal.

For example, the gate driving chip 120 provides a plurality of gate signals to the plurality of gate lines GL according to a plurality of gate control signals GCS originated from the timing controller 130. These gate signals are supplied to respective pixel unit 10 through a plurality of gate lines GL.

For example, the source driving chip 140, by using a reference gamma voltage, converts digital image data RGB input from the timing controller 130 into data signals according to a plurality of data control signals DCS originated from the timing controller 130. The source driving chip 140 provides the converted and compensated data signals to the plurality of data lines DL.

For example, the timing controller 130 processes externally input image data RGB to match a size and resolution of the display panel 110, and then provides the processed image data to the source driving chip 140. The timing controller 130 generates a plurality of gate control signals GCS and a plurality of data control signals DCS by using synchronization signals (e.g., a dot clock DCLK, a data enable signal DE, a horizontal synchronization signal Hsync, and a vertical synchronization signal Vsync) input from the external of the display device. The timing controller 130 provides the generated gate control signal GCS and data control signal DCS to the gate driving chip 120 and the source driving chip 140, respectively, so as to control the gate driving chip 120 and the source driving chip 140.

For example, the source driving chip 140 can be connected to the plurality of data lines DL to provide the data signals d1/d2; and at the same time, the source driving chip 140 can also be connected to a plurality of first voltage lines, a plurality of second voltage lines and a plurality of sensing lines to provide first voltages, second voltages and reference voltage signals Vref, respectively.

For example, the gate driving chip 120 and the source driving chip 140 can be implemented as semiconductor chips. The display device 100 can also include other components, such as a signal decoding circuit, a voltage conversion circuit, etc. These components can, for example, adopt components in the art, and details will not be described herein.

The specific description of the display panel can be referred to the description in the above-mentioned embodiments, which is not repeated in the embodiments of the present disclosure.

In practical application, the display device can be any product or component having a display function, such as a mobile phone, a tablet computer, a television, a display, a notebook computer, a navigator, etc.

In the embodiment of the disclosure, the display device includes the display panel, the plurality of pixel units arranged in an array and the data lines and sensing lines connected to the pixel units are arranged in the display panel, and each pixel unit includes the plurality of sub-pixels; all sub-pixels in a same column of pixel units are connected to a same data line, each column of pixel units are respectively connected to two sensing lines, and any two adjacent columns of pixel units share one sensing line. By setting that all sub-pixels in a same column of pixel units are connected to a same data line, each column of pixel units are respectively connected to two sensing lines and any two adjacent columns of pixel units share one sensing line, the amount of data lines and sensing lines is reduced; and when a source driving chip is subsequently connected to the data lines and sensing lines in the display panel by COF, hardware cost and bonding difficulty can be reduced, and bonding yield can be improved.

The embodiments of the present disclosure further provide a driving method of a display panel, which can be applied to drive the display panel 110 provided by the embodiments of the present disclosure. For example, in the example as shown in FIG. 1B, the driving method includes a display period and a blanking period for one frame. The driving method includes the following steps.

In the display period, sequentially providing, by the gate line groups, scan driving signals to the N rows of pixel units, so that pixel driving circuits in the N rows of pixel units drive light-emitting elements in the N rows of pixel units to emit light, respectively; and in the blanking period, providing, by the gate line groups, the scan driving signals to an (i)-th row of pixel units in the (n) rows of pixel units, so that sensing circuits in the (i)-th row of pixel units perform sense.

For example, $1 \leq i \leq N$.

For example, in some examples, in the display period, a driving cycle of each row of pixel units in the N rows of pixel units includes a first time period, a second time period, a third time period, and a fourth time period.

In the first time period, a scan driving signal of a first gate line in an (n−1)-th row and a scan driving signal input by the second gate line in the (n)-th row are both at a high level, so as to write a data voltage to a third sub-pixel of a pixel unit in the (n−1)-th row and the (m)-th column.

In the second time period, a scan driving signal of the second gate line in the (n)-th row and a scan driving signal of the first gate line in the (n)-th row are both at a high level, so as to write the data voltage into a second sub-pixel of the pixel unit in the (n−1)-th row and the (m)-th column and into the first sub-pixel of the pixel unit in the (n)-th row and the (m)-th column.

In the third time period, the scan driving signal input by the first gate line in the (n−1)-th row and the scan driving signal input by the second gate line in the (n)-th row are both at a low level, so that the third sub-pixel of the pixel unit in the (n−1)-th row and the (m)-th column emits light; and the scan driving signal of the first gate line in the (n)-th row and a scan driving signal of the second gate line in the (n+1)-th row are both at a high level, so as to write the data voltage to the third sub-pixel of the pixel unit in the (n)-th row and the (m)-th column.

In the fourth time period, the scan driving signal input by the second gate line in the (n)-th row and the scan driving signal input by the first gate line in the (n)-th row are both at a low level, so that the second sub-pixel of the pixel unit in the (n−1)-th row and the (m)-th column and the first sub-pixel of the pixel unit in the (n)-th row and the (m)-th column emit light; and the scan driving signal of the second gate line in the (n+1)-th row and a scan driving signal of the first gate line in the (n+1)-th row are both at a high level, so as to write the data voltage to the second sub-pixel of the pixel unit in the (n)-th row and the (m)-th column and into a first sub-pixel of the pixel unit in the (n+1)-th row and the (m)-th column.

For example, in the first time period to the fourth time period described above, reference voltage signals (e.g., at a low level) are input to the sensing line in the (m)-th column and the sensing line in the (m+1)-th column.

For example, in the blanking period, a driving cycle of each row of pixel units in the N rows of pixel units includes a fifth time period, a sixth time period, a seventh time period and an eighth time period.

In the fifth time period, a sensing voltage signal of a first sub-pixel of a pixel unit in an (n−1)-th row and the (m)-th column and a sensing voltage signal of a second sub-pixel of a pixel unit in an (n−2)-th row and the (m)-th column are read, so as to compensate for the first sub-pixel of the pixel unit in the (n−1)-th row and the (m)-th column and the second sub-pixel of the pixel unit in the (n−2)-th row and the (m)-th column.

In the sixth time period, a sensing voltage signal of a third sub-pixel of the pixel unit in the (n−1)-th row and the (m)-th column is read, so as to compensate for the third sub-pixel of the pixel unit in the (n−1)-th row and the (m)-th column.

In the seventh time period, a sensing voltage signal of the first sub-pixel of the pixel unit in the (n)-th row and the (m)-th column and a sensing voltage signal of a second sub-pixel of the pixel unit in the (n−1)-th row and the (m)-th column are read, so as to compensate for the first sub-pixel of the pixel unit in the (n)-th row and the (m)-th column and the second sub-pixel of the pixel unit in the (n−1)-th row and the (m)-th column.

In the eighth time period, a sensing voltage signal of the third sub-pixel of the pixel unit in the (n)-th row and the (m)-th column is read, so as to compensate for the third sub-pixel of the pixel unit in the (n)-th row and the (m)-th column.

For example, in the present example, $3 \leq n \leq N$, and N is a positive integer greater than 3.

It should be noted that the specific implementation process of each stage described above can be referred to the related description of FIG. 4 and FIG. 5, and details will not be repeated herein.

Regarding the technical effects of the driving method of the display panel, reference can be made to the technical effects of the display panel provided by the embodiments of the present disclosure, and details will not be repeated here.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What have been described above are only specific implementations of the present disclosure, and the protection scope of the present disclosure is not limited thereto. Therefore, the protection scope of the present disclosure should be determined based on the protection scope of the claims.

What is claimed is:

1. A display panel, comprising:

a plurality of pixel units arranged in an array, and data lines and sensing lines connected to the plurality of pixel units, respectively, each of the plurality of pixel units comprising a plurality of sub-pixels, gate line groups connected to the sub-pixels, wherein all sub-pixels in a same column of pixel units are connected to a same data line, each column of pixel units are respectively connected to two of the sensing lines, and any two adjacent columns of pixel units share one of the sensing lines;

each row of pixel units are respectively connected to two of the gate line groups to receive scan driving signals, any two adjacent rows of pixel units share one of the gate line groups, and each of the gate line groups comprises a first gate line and a second gate line;

wherein the display panel comprises M×N pixel units and N+1 rows of gate line groups, and each of the plurality of pixel units comprises a first sub-pixel, a second sub-pixel, and a third sub-pixel;

a first sub-pixel of a pixel unit in an (n)-th row and an (m)-th column is connected to a first gate line in the (n)-th row, a second gate line in the (n)-th row, a sensing line in the (m)-th column, and a data line in the (m)-th column, respectively;

a second sub-pixel of the pixel unit in the (n)-th row and the (m)-th column is connected to a first gate line in an (n+1)-th row, a second gate line in the (n+1)-th row, a sensing line in an (m+1)-th column, and a data line in the (m)-th column, respectively;

a third sub-pixel of the pixel unit in the (n)-th row and the (m)-th column is connected to the first gate line in the (n)-th row, the second gate line in the (n+1)-th row, the sensing line in the (m)-th column, and the data line in the (m)-th column; and M represents an amount of the pixel units in a row direction, N represents an amount of the pixel units in a column direction, 1≤n≤N, 1≤m≤M, and both M and N are positive integers greater than 1.

2. The display panel according to claim 1, wherein the scan driving signals comprises a first scan driving signal and a second scan driving signal;

each of the plurality of sub-pixels comprises a light-emitting element, a pixel driving circuit configured for driving the light-emitting element to emit light, and a sensing circuit configured for sensing the pixel driving circuit, wherein the pixel driving circuit comprises a data writing sub-circuit and a driving sub-circuit;

the driving sub-circuit is connected to the data writing sub-circuit, the light-emitting element, and the sensing circuit, and is configured to control a driving current for driving the light-emitting element to emit light;

the data writing sub-circuit is configured to receive the first scan driving signal, and to write a data voltage to the driving sub-circuit in response to the first scan driving signal; and the sensing circuit is further connected to the driving sub-circuit, and is configured to receive the second scan driving signal, and to write a reference voltage signal to the driving sub-circuit or to read a sensing voltage signal from the driving sub-circuit in response to the second scan driving signal.

3. The display panel according to claim 2, wherein the pixel driving circuit further comprises a storage sub-circuit, and the storage sub-circuit is connected to the light-emitting element and is configured to store the data voltage being written and the reference voltage signal.

4. The display panel according to claim 3, wherein the sensing circuit comprises a first transistor, the data writing sub-circuit comprises a second transistor, the driving sub-circuit comprises a driving transistor, and the storage sub-circuit comprises a storage capacitor;

for the first sub-pixel of the pixel unit in the (n)-th row and the (m)-th column, a gate electrode of the first transistor is connected to the first gate line in the (n)-th row, a first electrode of the first transistor is connected to the sensing line in the (m)-th column, a gate electrode of the second transistor is connected to the second gate line in the (n)-th row, and a first electrode of the second transistor is connected to the data line in the (m)-th column;

for the second sub-pixel of the pixel unit in the (n)-th row and the (m)-th column, a gate electrode of the first transistor is connected to the first gate line in the (n+1)-th row, a first electrode of the first transistor is connected to the sensing line in the (m+1)-th column, a gate electrode of the second transistor is connected to the second gate line in the (n+1)-th row, and a first electrode of the second transistor is connected to the data line in the (m)-th column;

for the third sub-pixel of the pixel unit in the (n)-th row and the (m)-th column, a gate electrode of the first transistor is connected to the second gate line in the (n+1)-th row, a first electrode of the first transistor is connected to the sensing line in the (m)-th column, a gate electrode of the second transistor is connected to the first gate line in the (n)-th row, and a first electrode of the second transistor is connected to the data line in the (m)-th column; and for any one of the sub-pixels, a second electrode of the first transistor is connected to a first terminal of the storage capacitor, a second electrode of the second transistor is connected to a second terminal of the storage capacitor, a gate electrode of the driving transistor is connected to the second electrode of the second transistor, a first electrode of the driving transistor is connected to an anode of the light-emitting element, a second electrode of the driving transistor is connected to a first voltage terminal to receive a first voltage, the first terminal of the storage capacitor is further connected to the anode of the light-emitting element, and a cathode of the light-emitting element is connected to a second voltage terminal to receive a second voltage.

5. The display panel according to claim 4, wherein the first transistor, the second transistor, and the driving transistor are all N-type transistors or are all P-type transistors.

6. The display panel according to claim 3, wherein a color of light emitted by first sub-pixels of pixel units in the (n)-th row is identical to a color of light emitted by second sub-pixels of pixel units in the (n+1)-th row, and a color of light emitted by second sub-pixels of the pixel units in the (n)-th row is identical to a color of light emitted by the first sub-pixels of the pixel units in the (n+1)-th row.

7. The display panel according to claim 3, wherein colors of light emitted by third sub-pixels in respective pixel units are identical to each other.

8. The display panel according to claim 3, wherein a color of light emitted by the first sub-pixel, a color of light emitted by the second sub-pixel, and a color of light emitted by the third sub-pixel are different from each other in each of the plurality of pixel units.

9. A display device, comprising the display panel according to claim 1.

10. The display device according to claim 9, further comprising a source driving chip, wherein the source driving chip is connected to the data lines in the display panel to provide data voltages, and the source driving chip is connected to the sensing lines in the display panel to provide reference voltage signals or to receive sensing voltage signals.

11. The display device according to claim 9, further comprising a gate driving chip, wherein the gate driving chip is connected to gate line groups in the display panel, and is configured to provide scan driving signals to the plurality of pixel units in the display panel through the gate line groups.

12. A driving method of the display panel according to claim 3, comprising a display period and a blanking period for one frame, wherein the driving method comprises:
  in the display period, sequentially providing, by the gate line groups, the scan driving signals to the N rows of pixel units, so that pixel driving circuits in the N rows of pixel units drive light-emitting elements in the N rows of pixel units to emit light, respectively; and
  in the blanking period, providing, by the gate line groups, the scan driving signals to an (i)-th row of pixel units in the N rows of pixel units, so that sensing circuits in the (i)-th row of pixel units perform sense,
  wherein $1 \leq i \leq N$.

13. The driving method of the display panel according to claim 12, wherein in the display period, a driving cycle of each row of pixel units in the N rows of pixel units comprises a first time period, a second time period, a third time period, and a fourth time period;
  in the first time period, a scan driving signal of a first gate line in an (n−1)-th row and a scan driving signal input by the second gate line in the (n)-th row are both at a high level, so as to write a data voltage to a third sub-pixel of a pixel unit in the (n−1)-th row and the (m)-th column;
  in the second time period, a scan driving signal of the second gate line in the (n)-th row and a scan driving signal of the first gate line in the (n)-th row are both at a high level, so as to write the data voltage into a second sub-pixel of the pixel unit in the (n−1)-th row and the (m)-th column and into the first sub-pixel of the pixel unit in the (n)-th row and the (m)-th column;
  in the third time period, the scan driving signal input by the first gate line in the (n−1)-th row and the scan driving signal input by the second gate line in the (n)-th row are both at a low level, so that the third sub-pixel of the pixel unit in the (n−1)-th row and the (m)-th column emits light; and the scan driving signal of the first gate line in the (n)-th row and a scan driving signal of the second gate line in the (n+1)-th row are both at a high level, so as to write the data voltage to the third sub-pixel of the pixel unit in the (n)-th row and the (m)-th column; and
  in the fourth time period, the scan driving signal input by the second gate line in the (n)-th row and the scan driving signal input by the first gate line in the (n)-th row are both at a low level, so that the second sub-pixel of the pixel unit in the (n−1)-th row and the (m)-th column and the first sub-pixel of the pixel unit in the (n)-th row and the (m)-th column emit light; and the scan driving signal of the second gate line in the (n+1)-th row and a scan driving signal of the first gate line in the (n+1)-th row are both at a high level, so as to write the data voltage to the second sub-pixel of the pixel unit in the (n)-th row and the (m)-th column and into a first sub-pixel of the pixel unit in the (n+1)-th row and the (m)-th column.

14. The driving method of the display panel according to claim 13, further comprising:
  inputting a reference voltage signal to both a sensing line in the (m)-th column and a sensing line in the (m+1)-th column.

15. The driving method of the display panel according to claim 12, wherein in the blanking period, a driving cycle of each row of pixel units in the N rows of pixel units comprises a fifth time period, a sixth time period, a seventh time period, and an eighth time period;
  in the fifth time period, a sensing voltage signal of a first sub-pixel of a pixel unit in an (n−1)-th row and the (m)-th column and a sensing voltage signal of a second sub-pixel of a pixel unit in an (n−2)-th row and the (m)-th column are read, so as to compensate for the first sub-pixel of the pixel unit in the (n−1)-th row and the (m)-th column and the second sub-pixel of the pixel unit in the (n−2)-th row and the (m)-th column;
  in the sixth time period, a sensing voltage signal of a third sub-pixel of the pixel unit in the (n−1)-th row and the (m)-th column is read, so as to compensate for the third sub-pixel of the pixel unit in the (n−1)-th row and the (m)-th column;
  in the seventh time period, a sensing voltage signal of the first sub-pixel of the pixel unit in the (n)-th row and the (m)-th column and a sensing voltage signal of a second sub-pixel of the pixel unit in the (n−1)-th row and the (m)-th column are read, so as to compensate for the first sub-pixel of the pixel unit in the (n)-th row and the (m)-th column and the second sub-pixel of the pixel unit in the (n−1)-th row and the (m)-th column; and
  in the eighth time period, a sensing voltage signal of the third sub-pixel of the pixel unit in the (n)-th row and the (m)-th column is read, so as to compensate for the third sub-pixel of the pixel unit in the (n)-th row and the (m)-th column,
  wherein $3 \leq n \leq N$, and N is a positive integer greater than 3.

16. The display panel according to claim 5, wherein a color of light emitted by first sub-pixels of pixel units in the (n)-th row is identical to a color of light emitted by second sub-pixels of pixel units in the (n+1)-th row, and a color of light emitted by second sub-pixels of the pixel units in the (n)-th row is identical to a color of light emitted by the first sub-pixels of the pixel units in the (n+1)-th row.

17. The display panel according to claim 15, wherein colors of light emitted by third sub-pixels in respective pixel units are identical to each other.

18. The display panel according to claim 17, wherein a color of light emitted by the first sub-pixel, a color of light emitted by the second sub-pixel, and a color of light emitted by the third sub-pixel are different from each other in each of the plurality of pixel units.

* * * * *